United States Patent
Nickl

(10) Patent No.: US 10,784,852 B2
(45) Date of Patent: Sep. 22, 2020

(54) PULSE GENERATOR AND CONSUMPTION METER

(71) Applicant: DIEHL METERING GMBH, Ansbach (DE)

(72) Inventor: Stefan Nickl, Stein (DE)

(73) Assignee: Diehl Metering GmbH, Ansbach (DE)

( * ) Notice: Subject to any disclaimer, the term of this patent is extended or adjusted under 35 U.S.C. 154(b) by 0 days.

(21) Appl. No.: 16/571,648

(22) Filed: Sep. 16, 2019

(65) Prior Publication Data

US 2020/0091908 A1    Mar. 19, 2020

(30) Foreign Application Priority Data

Sep. 14, 2018 (DE) .................. 10 2018 007 284

(51) Int. Cl.
 *H03K 17/10* (2006.01)
 *H03K 17/689* (2006.01)
 *H03K 17/785* (2006.01)

(52) U.S. Cl.
 CPC ......... *H03K 17/102* (2013.01); *H03K 17/689* (2013.01); *H03K 17/785* (2013.01)

(58) Field of Classification Search
 CPC ... H03K 17/102; H03K 17/689; H03K 17/785
 USPC ....................... 327/427, 434, 437
 See application file for complete search history.

(56) References Cited

U.S. PATENT DOCUMENTS

| 3,487,284 A | * | 12/1969 | Cady ................. | H02J 7/008 320/143 |
| 5,693,952 A | * | 12/1997 | Cox ................... | A61N 1/3931 250/551 |
| 2007/0084987 A1 | * | 4/2007 | Bauhahn ............. | H03K 17/785 250/214 R |
| 2015/0082904 A1 | * | 3/2015 | Hunter ................ | G01J 1/44 73/861.08 |

FOREIGN PATENT DOCUMENTS

| DE | 4040164 A1 | 6/1992 |
| DE | 4040165 A1 | 6/1992 |
| DE | 102008011609 A1 | 10/2009 |
| JP | H04332217 A | 11/1992 |
| WO | 9722382 A1 | 6/1997 |
| WO | 2015068194 A1 | 5/2015 |

\* cited by examiner

*Primary Examiner* — Tomi Skibinski
(74) *Attorney, Agent, or Firm* — Laurence A. Greenberg; Werner H. Stemer; Ralph E. Locher

(57) ABSTRACT

A pulse generator has a galvanically isolated output, in particular for a consumption meter. A control output of a control unit of the pulse generator is coupled to an input of an opto-isolator of the pulse generator in order to output at the output of the opto-isolator an output current controlled by the control unit. The opto-isolator is connected to a field-effect transistor in such a way that the output current from the opto-isolator charges a capacitor via a rectifying component, which blocks the capacitor from discharging via the opto-isolator. The voltage drop across the capacitor is the gate voltage of the field-effect transistor. The field-effect transistor switches the output of the pulse generator directly or indirectly.

10 Claims, 2 Drawing Sheets

PULSE GENERATOR AND CONSUMPTION METER

CROSS-REFERENCE TO RELATED APPLICATION

This application claims the priority, under 35 U.S.C. § 119, of German application DE 10 2018 007 284.4, filed Sep. 14, 2019; the prior application is herewith incorporated by reference in its entirety.

BACKGROUND OF THE INVENTION

Field of the Invention

The invention relates to a pulse generator having a galvanically isolated output, in particular for a consumption meter. A control output of a control unit of the pulse generator is coupled to an input of an opto-isolator of the pulse generator in order to output at the output of the opto-isolator an output current controlled by the control unit.

A pulse generator, for example which switches a pulse line between two defined states by switching impedances or potentials, is a simple means of one device providing information to another device. Such pulse generators are used, for example, in consumption meters, so for instance in water meters, gas meters, heat meters and the like, in order to provide measurement data, or a quantity determined from this data, for instance an integral of the fluid flow rate as the consumption, to external devices. This makes it possible for an end consumer, for example, to process further the data provided by a meter.

If the pulse generator is galvanically coupled to another circuit, for instance to a measurement circuit, then sharp-edged switching and/or interference introduced by the external device can perturb this circuit. It is therefore expedient to decouple the output of the pulse generator from other devices, for instance from a measurement device of the consumption meter. This can be done using an opto-isolator, for example. On the input side, opto-isolators contains a light source, for instance a light emitting diode, controlled by the control signal. On the output side, either an impedance is switched, for example by a photoresistor or a photo field-effect transistor, or an output current, which can be defined by the incident light, is output, for instance by using at least one photodiode on the output side.

If such an opto-isolator is meant to be operated over prolonged periods or using large pulse widths in a state in which an internal light source is active, this results in relatively high energy consumption. This can be a problem especially if the pulse generator is used in a battery-powered device, for instance in a battery-powered consumption meter. This can be avoided by using edge-controlled opto-isolators, which comprise dedicated memory logic for maintaining a switching state, once set, over prolonged periods. Suitable memory logic, however, requires an additional power supply in order to preserve the galvanic isolation. This increases the production costs of the pulse generator and of a consumption meter containing the pulse generator.

SUMMARY OF THE INVENTION

Thus the object of the invention is to define a pulse generator that, despite a relatively simple and advantageous design, can achieve high energy efficiency even for large pulse widths.

The object is achieved according to the invention by a pulse generator of the type mentioned in the introduction, wherein the opto-isolator is connected to a field-effect transistor in such a way that the output current from the opto-isolator charges a capacitor via a rectifying component, for example a diode, which blocks the capacitor from discharging via the opto-isolator. The voltage drop across the capacitor is the gate voltage of the field-effect transistor, and the field-effect transistor switches the output of the pulse generator directly or indirectly.

In the pulse generator according to the invention, an opto-isolator is used that provides an output current according to an input signal. Such an opto-isolator can be provided, for example, by using an input-side light emitting diode and an output-side photodiode or a plurality of output-side photodiodes. The output current substantially follows the input signal. The capacitor integrates the output current, whereby the voltage drop across the capacitor increases as long as light is incident on the output-side photodiode, for example. As soon as the voltage drop across the capacitor is sufficiently large, the field-effect transistor and hence the output of the pulse generator switches. The field-effect transistor can switch the pulse output directly or indirectly via additional components, for example an additional transistor, an amplifier or the like.

Were the capacitor to be coupled to the opto-isolator without the rectifying component connected therebetween, then when light is no longer incident on the output-side photodiode, the capacitor would be discharged via this photodiode, whereby in turn the field-effect transistor and hence the output would be switched. An output signal from the pulse generator would hence essentially correspond to a slightly delayed signal at the control output.

This discharge is prevented by using the rectifying component connected between the opto-isolator and the capacitor, with the result that the capacitor initially continues to remain charged even when light is no longer incident on the output-side photodiode of the opto-isolator. The capacitor preferably discharges very slowly in at least one state of the pulse generator, for example solely via leakage currents. As will be explained in greater detail later, the capacitor can be discharged deliberately if required in order to switch back the output of the pulse generator. Alternatively, for example, a relatively large resistance could be connected in parallel with the capacitor so that the capacitor discharges over a defined time interval. It is thereby possible, for example, to implement a pulse generator in which a switching state of the field-effect transistor, or at the output of the pulse generator, is maintained, for instance, longer by a predetermined time than a pulse at the control output of the control unit that initiates this switching.

The pulse output of the pulse generator can be switched between two defined voltage levels. A particularly low energy consumption of the pulse generator, or of a device containing the pulse generator, can be achieved, however, if the pulse output has two connecting terminals and if an impedance, which is arranged between these terminals, is switched. For example, it is possible to switch between a substantially open circuit between the two connecting terminals and a defined resistance.

The terminals of the capacitor can be connected to output-side connecting terminals of an additional opto-isolator, wherein an input of the additional opto-isolator is coupled to an additional control output of the control unit. The additional opto-isolator can define on the output side, in particular depending on the drive by the control unit, a resistance between the terminals of the capacitor. An opto-isolator containing on the output side a phototransistor, in particular a photo field-effect transistor, is preferably used as the additional opto-isolator. Alternatively, an opto-isolator having an output-side photoresistor or an opto-isolator having an inverted output could be used, for example. The capacitor can be discharged deliberately by driving the additional opto-isolator, thereby reducing a voltage drop across this capacitor, whereby the field-effect transistor and hence the output of the pulse generator can be switched back into an initial state.

The pulse generator can be configured to set a switching state of the output of the pulse generator for a predetermined time interval. The control unit outputs a control pulse at the additional control output at the end of the predetermined time interval. Switching into the switching state at the output of the pulse generator can be performed, as explained in more detail later, by outputting at least one switching pulse at the control output of the control unit. As explained in the introduction, this can lead to this switching state being held for a longer period. The capacitor can be discharged deliberately, and hence the output of the pulse generator can be switched back by outputting a control pulse at the additional opto-isolator.

The pulse generator can be configured to set the switching state, or a switching state, of the output of the pulse generator for the, or a, predetermined time interval, by the control unit outputting at the control output a plurality of pulses during the predetermined time interval. The output of a pulse at the control output causes the opto-isolator to output a current pulse. This leads to the capacitor being charged by an amount of current that depends in particular on the length of the pulse at the control output. It is then possible by suitable selection of the pulse length and/or by outputting a suitable number of pulses to make the voltage drop across the capacitor sufficient to switch the field-effect transistor and hence the output of the pulse generator. Since typically the capacitor discharges slightly, for instance via a large discharge resistor or via leakage currents, additional pulses can additionally be output at the control output during the time interval in order that additional current pulses at the output of the opto-isolator keep the charge stored in the capacitor high enough for the voltage drop across the capacitor to be sufficient to maintain the switching state of the field-effect transistor. It is hence possible to maintain a switching state of the field-effect transistor by outputting control pulses at time intervals at the control output. If, on the other hand, the opto-isolator were to switch the output of the pulse generator directly, this would require the control unit to supply current continuously to the opto-isolator. In contrast, the control unit using pulses at time intervals to supply current to the opto-isolator via the control output requires far less energy, and therefore the pulse generator can have a particularly power-efficient design.

The control unit can be configured to output at the control output, at the start of the predetermined time interval, a first pulse having a first length, and then during the time interval at least a second pulse having a second length, which is shorter than the first length. The first pulse is used, as explained above, to charge the capacitor to such a level that the field-effect transistor switches. The subsequent pulses must solely compensate for the discharge via leakage currents and/or via a discharge resistor, which is typically selected to have a large value, and can thus be considerably shorter. The first pulse may be several 10 µs long, for example 24 µs. The subsequent pulses may be several µs long, for example 4 µs. Each of the pulses can be sufficient to charge the capacitor sufficiently strongly to maintain the switching state of the field-effect transistor for several 100 µs, preferably several ms. It is thereby possible, for example, that after the first pulse for 2 ms no further pulses follow, and/or that the pulses for maintaining the charge are output at an interval of 1 ms, and despite these relatively large pulse intervals, a switching state of the field-effect transistor is maintained.

The first pulse may be longer than the second pulse at least by a factor of two or at least by a factor of five, or the second pulses and/or the interval between successive pulses can be at least ten times, or at least thirty times, as large as the pulse length. As explained previously, even larger differences in the pulse lengths or even larger intervals between the pulses can actually be used.

The capacitor can be formed entirely or at least in part by a gate capacitor of the field-effect transistor. It is possible, in principle, that solely a capacitor provided by the field-effect transistor itself is charged as the capacitor. For example, a capacitor that exists between gate terminal and source terminal of the field-effect transistor can be charged. However, in order to be able to maintain for a longer time a switching state of the field-effect transistor or of the output of the pulse generator in spite of leakage currents present, a larger capacitor should preferably be used, which can be achieved by using an additional capacitor, in particular an additional capacitor.

In particular, the capacitor can be formed at least in part by a capacitor, in particular a capacitor, that is connected between two connecting terminals of the field-effect transistor. The additional capacitor can thus be connected in parallel with the gate capacitor of the field-effect transistor. The effect of the gate capacitor on the switching behaviour of the pulse output can hence be reduced. The capacitor of the capacitor may be, for example, five times to twenty times as large as the gate capacitor, for instance about ten times as large. In particular, the capacitor can be connected between a gate terminal and a source terminal of the field-effect transistor. Connecting the capacitor in parallel with the capacitor of the field-effect transistor results in a larger total capacitor. This means that more charge is stored by the capacitor for the same voltage drop across the capacitor, as a result of which, given an identical leakage current and/or identical discharge resistor, it takes longer for the voltage drop across the capacitor to fall and thus for the field-effect transistor or the output of the pulse generator to switch back. For example, if a discharge resistor for leakage currents of 12 MΩ is assumed, then capacitors of several 10 pF, for instance 27 pF, are sufficient to achieve the aforementioned pulse intervals for the stated pulse lengths.

A metal-oxide-semiconductor field-effect transistor, for example, can be used as the field-effect transistor.

In addition to the pulse generator according to the invention, the invention also relates to a consumption meter for recording an energy consumption and/or the consumption or flow rate of a fluid, which meter contains a pulse generator according to the invention, in particular in order to provide measurement data, or data derived from this measurement data, to a separate device. In particular, the pulse generator may be integrated in a control unit or processing unit of the consumption meter.

Other features which are considered as characteristic for the invention are set forth in the appended claims.

Although the invention is illustrated and described herein as embodied in a pulse generator, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
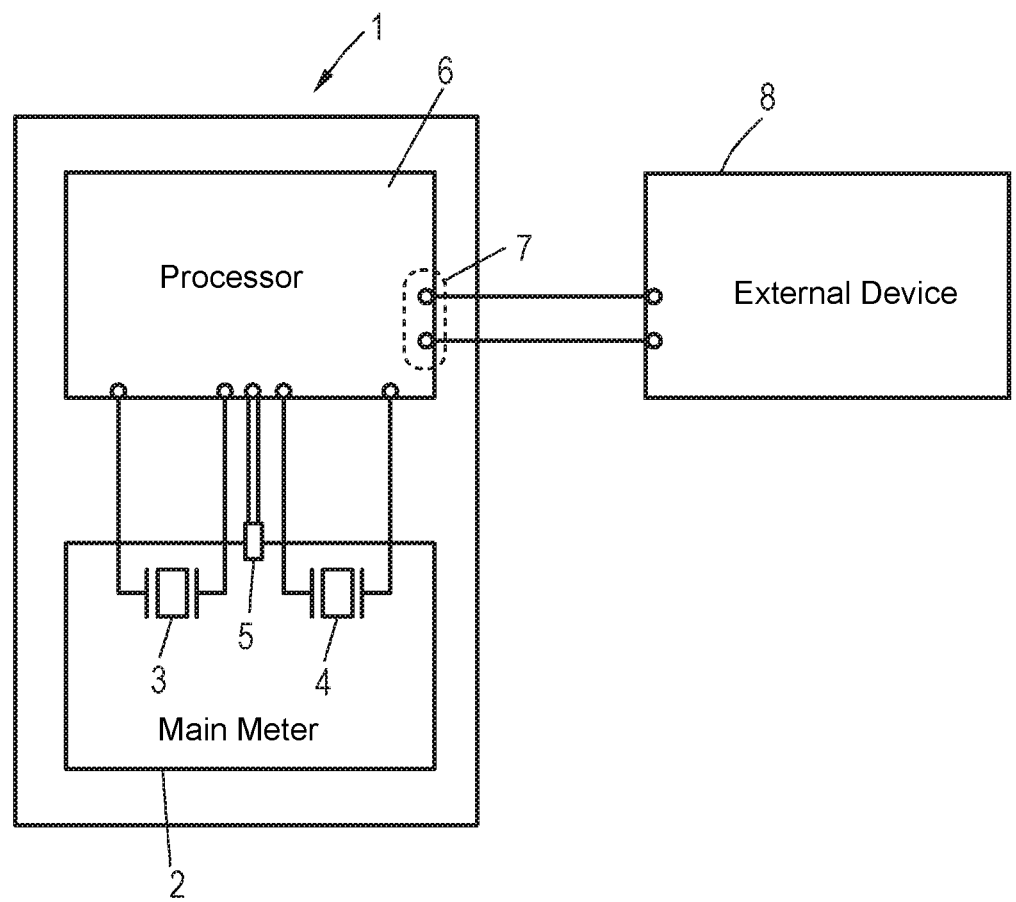
FIG. 1 is schematic illustration of an exemplary embodiment of a consumption meter according to the invention.

Referring now to the figures of the drawings in detail and first, particularly to FIG. 1 thereof, there is shown a consumption meter 1, which in the example is an ultrasonic meter for measuring a flow rate of a fluid. The consumption meter 1 has a main meter 2, i.e. a sensor system arranged directly on a measuring pipe, and a processor 6, which controls the sensor system and processes the values measured by the sensor system. The sensor system contains two ultrasonic transducers 3, 4 and a temperature sensor 5. The ultrasonic transducers 3, 4 can be used to emit ultrasonic waves into a fluid flowing through a measuring pipe (not shown), and to receive ultrasonic waves from this fluid. A flow velocity can be obtained by measuring a transit-time difference between the transit times from the ultrasonic transducer 3 to the ultrasonic transducer 4 and vice versa. This procedure is well known in the prior art and shall not be explained in detail.

The meter 1 typically contains only limited means for visualizing and processing the measurement data. For example, a display (not shown) for displaying cyclically determined measurement quantities or the like can be provided on the consumption meter 1. To allow further processing or longer-term storage of the measurement data, this data can be provided to an external device 8 by a pulse generator 7. The external device 8 can be used, for example, for reading measured values from the consumption meter by means of a reader, or a device of an end user that provides the end user, for example, with an itemized time-based consumption or the like can be used as the separate device 8.

Figure 2:
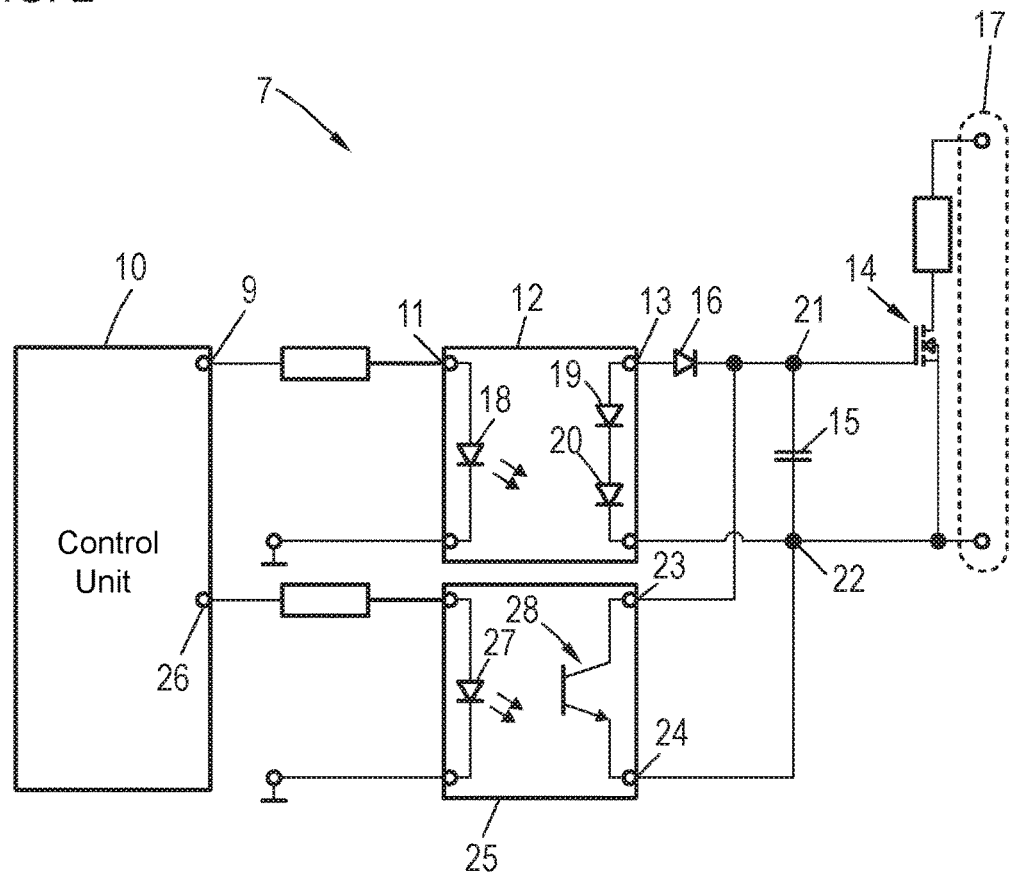
FIG. 2 is a schematically, detailed view of the consumption meter shown in FIG. 1, illustrating an exemplary embodiment of a pulse generator according to the invention.

FIG. 2 shows the pulse generator 7 in detail. An output 17 of the pulse generator 7 is galvanically isolated from the additional circuit of the processor and in particular from the sensor system in the main meter 2, in order to prevent the separate device 8 from introducing any interference. This galvanic isolation is achieved in the pulse generator 7 by means of the two opto-isolators 12, 25.

The two connection points of the output 17 are selectively connected and disconnected from each other by a field-effect transistor 14 in order to output pulses at the output 17. The output state of the pulse generator can be detected by means of the separate device 8 for example by measuring a voltage drop across the output 17 of the pulse generator 7. It is also possible, for example, to implement a changeover mechanism between defined voltages at the output 17 by a minor modification to the pulse generator 7, namely by coupling one of the connection points to a current source, or via a resistor to a voltage source, and coupling the other of the connection points to a separate ground potential.

In principle, galvanic isolation could be achieved by the field-effect transistor 14 being a photo field-effect transistor of an opto-isolator that is controlled by a control unit 10. In this case, however, if the field-effect transistor 14 is meant to be switched into the conducting state for prolonged periods, the control unit 10 would need to output a control signal during the entire time. This is disadvantageous because the continuous supply of current to such an opto-isolator by the control unit 10 results in a relatively high current consumption. As will be discussed in greater detail below, this can be avoided by the circuit shown in FIG. 2 for the pulse generator 7.

In FIG. 2, a control output 9 of the control unit 10, which unit can be implemented, for example, by a processing unit or control unit of the processor 6, is coupled to an input of an opto-isolator 12, whereby the opto-isolator 12 can provide at an output 13 an output current that can be controlled, in particular digitally switched on and off, by the control unit 10. The opto-isolator 12 is connected to the field-effect transistor 14 in such a way that the output current from the opto-isolator 12 charges a capacitor 15 via a rectifying component 16, for instance a diode, which blocks the capacitor 15 from discharging via the opto-isolator 12. The voltage drop across the capacitor 15 is the gate voltage of the field-effect transistor 14. If the voltage drop across the capacitor 15 is very low, the field-effect transistor 14 can have a very high, essentially infinite, resistance, whereby the connection points of the output 17 are in the disconnected state. If the capacitor 15 is charged to a sufficiently high level, the voltage drop across this capacitor switches the field-effect transistor 14, causing the resistance thereof to become very low, thereby connecting the connection points of the output 17 of the pulse generator 7 via a defined resistance.

Since the rectifying component 16 prevents the capacitor 15 from being discharged via the opto-isolator 12, and the gate of the field-effect transistor 14 is isolated from the other connecting terminals, the capacitor 15 is discharged only through leakage currents or a discharge resistor (not shown), which is selected to have a relatively large value. Thus if a pulse is output at the control output 9 that is sufficiently long to switch the field-effect transistor 14 by means of the charging of the capacitor 15 by the output current from the opto-isolator 12, then this switching state is maintained over a prolonged period, even if the pulse has long since come to an end at the control output 9, as a result of which, in the opto-isolator 12, no light is emitted via the light emitting diode 18 and hence the photodiodes 19, 20 no longer provide any more charging current for the capacitor 15.

Figure 3:
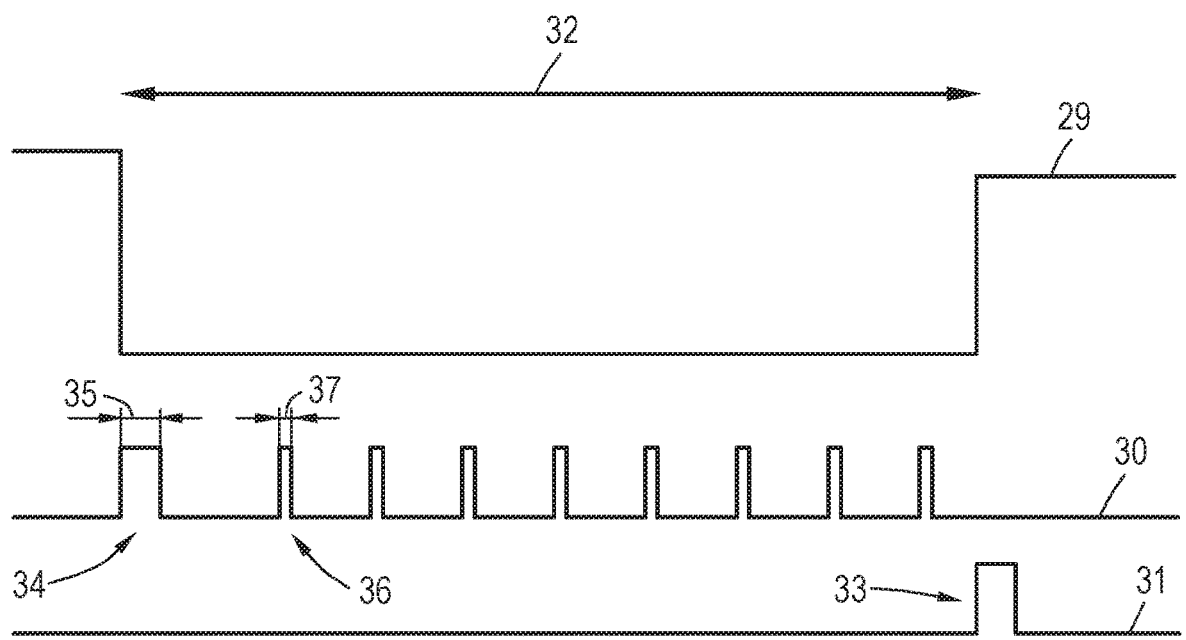
FIG. 3 is a schematic illustration of an output signal of the pulse generator shown in FIG. 2 and the control signals output by a control unit for providing this output signal.

As a result of leakage currents discharging the capacitor 15, then if the output 17 of the pulse generator 7 is meant to be switched for very long periods, it may be desirable to output short pulses repeatedly at the control output 9 in order to compensate for the charge lost by leakage currents. This is explained further below with reference to FIG. 3. FIG. 3 shows three signals 29, 30, 31, wherein the signal 29 is a voltage drop that can be measured across the output 17 of the pulse generator by the external apparatus 8. The signals 30 and 31 are control signals, which are output by the control unit at the control output 9 and the additional control output 26. Just the signals 29 and 30 are discussed first. The intention is to set at the output 17 for the time interval 32 a defined switching state, in which the field-effect transistor 14 and hence the output 17 has a low impedance, resulting in a small voltage drop across the output 17. In order to achieve this, a sufficient gate voltage must be applied to the field-effect transistor 14, which means that the capacitor 15 is meant to store a sufficiently large charge. The pulse 34 having a defined length 35 can be output in order to switch the field-effect transistor 14 for the first time. This length may be several 10 µs, for example. The length 35 is selected such that the time integral of the output current output by the opto-isolator 12 over this time is sufficient to charge the capacitor 15 to such a level that the voltage drop across the capacitor switches the field-effect transistor 14.

Since the capacitor 15 is discharged over time through leakage currents or a discharge resistor (not shown), it is necessary to recharge the capacitor 15 occasionally in order to ensure that the voltage drop across the capacitor continues to be enough to switch the field-effect transistor 14. This is done by starting to output, for instance after 2 ms, via the control output 9 additional short pulses 36 for charge conservation. The length 37 of these pulses 36 is preferably shorter than the length 35 of the pulse 34, because these pulses 36 are used solely to provide at the output 13 of the opto-isolator 12 sufficient charging current for the capacitor 15 to compensate for losses. The pulse 36 can be repeated at an interval of 1 ms, for example, in order to maintain the charge level of the capacitor 15. This can achieve that a switching state of the output 17 can be maintained over a relatively long time interval 32, with the control unit 10 having to output only relatively short pulses 34, 36 during this time interval 32 in order to maintain the switching state.

If solely the opto-isolator 12 is used to control the field-effect transistor 14, then typically it would be possible to define only with relatively low precision the time at which the field-effect transistor 14 switches back to its initial state at the end of the time interval 32. Therefore in the circuit shown in FIG. 2, an additional control output 26 of the control unit 10 is provided, which controls an additional opto-isolator 25, the output-side connecting terminals 23, 24 of which are connected to the terminals 21, 22 of the capacitor 15. On the input side, the opto-isolator 25 comprises a light emitting diode 27. On the output side is provided an illumination-dependent impedance, in particular a photo field-effect transistor 28. The control unit 10 is configured to output at the control output 26 at the end of the predetermined time interval 32, the control pulse 33 shown in FIG. 3. The light emitting diode 27 is thereby activated, and the photo field-effect transistor 28 is turned on, whereby the capacitor 15 is short-circuited or preferably is discharged via a discharge capacitor (not shown), whereby the field-effect transistor 14 and hence also the output 17 of the pulse generator 7 switches.

The following is a summary list of reference numerals and the corresponding structure used in the above description of the invention:

1 consumption meter
2 main meter
3 ultrasonic transducer
4 ultrasonic transducer
5 temperature sensor
6 processor
7 pulse generator
8 device
9 control output
10 control unit
11 input
12 opto-isolator
13 output
14 field-effect transistor
15 capacitor
16 rectifying component
17 output
18 light emitting diode
19 photodiode
20 photodiode
21 terminal
22 terminal
23 connecting terminal
24 connecting terminal
25 opto-isolator
26 control output
27 light emitting diode
28 photo field-effect transistor
29 signal
30 signal
31 signal
32 time interval
33 control pulse
34 pulse
35 length
36 pulse
37 length

The invention claimed is:

1. A pulse generator, comprising:
a galvanically isolated output;
an opto-isolator having an input and an output;
a field-effect transistor;
a capacitor;
a rectifying component;
a controller having a control output coupled to said input of said opto-isolator to output at said output of said opto-isolator an output current controlled by said controller, wherein said controller being configured to set a switching state of said galvanically isolated output for a predetermined time interval, by said controller outputting at said control output a plurality of pulses during the predetermined time interval, wherein said controller is configured to output at said control output, at a start of the predetermined time interval, a first pulse having a first length, and then during the predetermined time interval at least a second pulse having a second length, which is shorter than the first length;
said opto-isolator is coupled to said field-effect transistor in such a way that the output current from said opto-isolator charges said capacitor via said rectifying component, said rectifying component blocks said capacitor from discharging via said opto-isolator, wherein a voltage drop across said capacitor is a gate voltage of said field-effect transistor; and
said field-effect transistor switches said galvanically isolated output directly or indirectly.

2. The pulse generator according to claim 1,
further comprising an additional opto-isolator having output-side connecting terminals and an input;
wherein said controller has an additional control output;
wherein said capacitor has terminals connected to said output-side connecting terminals of said additional opto-isolator; and
wherein said input of said additional opto-isolator is coupled to said additional control output of said controller.

3. The pulse generator according to claim 2, wherein said controller is configured to set a switching state of said galvanically isolated output for a predetermined time interval, by said controller outputting a control pulse at said additional control output at an end of the predetermined time interval.

4. The pulse generator according to claim 1, wherein:
the first pulse is longer than the second pulse at least by a factor of two; or
the second pulse is one of a plurality of second pulses and/or an interval between successive said second pulses is at least ten times as large as the second pulse length.

5. The pulse generator according to claim 4, wherein:
the first pulse is longer than the second pulse at least by a factor of five; or
the second pulses and/or the interval between successive said second pulses is at least thirty times as large as said second pulse length.

6. The pulse generator according to claim 1, wherein said capacitor is formed entirely or at least in part by a gate capacitor of said field-effect transistor.

7. The pulse generator according to claim 1, wherein:
said field-effect transistor has connecting terminals; and
said capacitor is formed at least in part by a capacitor connected between two of said connecting terminals of said field-effect transistor.

8. The pulse generator according to claim 1, wherein said field-effect transistor is a metal-oxide-semiconductor field-effect transistor.

9. The pulse generator according to claim 1, wherein the pulse generator is configured for operation in a consumption meter.

10. A consumption meter for recording energy consumption and/or a consumption of a fluid, the consumption meter comprising:

a pulse generator, containing:
  a galvanically isolated output;
  an opto-isolator having an input and an output;
  a field-effect transistor;
  a capacitor;
  a rectifying component;
  a controller having a control output coupled to said input of said opto-isolator to output at said output of said opto-isolator an output current controlled by said controller, wherein said controller being configured to set a switching state of said galvanically isolated output for a predetermined time interval, by said controller outputting at said control output a plurality of pulses during the predetermined time interval, wherein said controller is configured to output at said control output, at a start of the predetermined time interval, a first pulse having a first length, and then during the predetermined time interval at least a second pulse having a second length, which is shorter than the first length;
  said opto-isolator is coupled to said field-effect transistor in such a way that the output current from said opto-isolator charges said capacitor via said rectifying component, said rectifying component blocks said capacitor from discharging via said opto-isolator, wherein a voltage drop across said capacitor is a gate voltage of said field-effect transistor; and
  said field-effect transistor switches said galvanically isolated output directly or indirectly; and
a separate device, said pulse generator providing measurement data, or data derived from the measurement data, to said separate device.

* * * * *